United States Patent
Yukawa

(10) Patent No.: US 9,321,862 B2
(45) Date of Patent: Apr. 26, 2016

(54) PHOTOSENSITIVE RESIN COMPOSITION

(75) Inventor: Shojiro Yukawa, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 239 days.

(21) Appl. No.: 14/116,241

(22) PCT Filed: May 9, 2012

(86) PCT No.: PCT/JP2012/061882
§ 371 (c)(1),
(2), (4) Date: Nov. 7, 2013

(87) PCT Pub. No.: WO2012/160975
PCT Pub. Date: Nov. 29, 2012

(65) Prior Publication Data
US 2014/0080937 A1 Mar. 20, 2014

(30) Foreign Application Priority Data
May 20, 2011 (JP) ................................. 2011-113844

(51) Int. Cl.
C08F 2/46 (2006.01)
C08F 2/50 (2006.01)
C08G 61/04 (2006.01)
C08F 26/06 (2006.01)
C08F 12/22 (2006.01)
C08F 212/14 (2006.01)
C08F 12/08 (2006.01)
G03F 7/00 (2006.01)
G03F 7/023 (2006.01)

(52) U.S. Cl.
CPC .............. C08F 26/06 (2013.01); C08F 12/08 (2013.01); C08F 12/22 (2013.01); C08F 212/14 (2013.01); G03F 7/0005 (2013.01); G03F 7/0233 (2013.01)

(58) Field of Classification Search
CPC .......... C08F 26/06; C08F 12/08; C08F 12/22; C08F 212/14; C08F 222/40; C08F 212/08; G03F 7/0233; G03F 7/0005
USPC .................... 522/107, 104, 1; 520/1
See application file for complete search history.

(56) References Cited

U.S. PATENT DOCUMENTS

| | | | |
|---|---|---|---|
| 2004/0241574 A1 | 12/2004 | Dai et al. | |
| 2005/0026071 A1 | 2/2005 | Lee | |
| 2007/0154839 A1 | 7/2007 | Jung | |
| 2008/0241740 A1* | 10/2008 | Oohashi | 430/270.1 |
| 2011/0117477 A1* | 5/2011 | Pareek et al. | 430/2 |

FOREIGN PATENT DOCUMENTS

| | | |
|---|---|---|
| JP | A-55-066910 | 5/1980 |
| JP | A-59-223706 | 12/1984 |
| JP | A-04-124144 | 4/1992 |
| JP | A-04-124145 | 4/1992 |
| JP | A-07-025918 | 1/1995 |
| JP | A-08-073690 | 3/1996 |
| JP | A-08-081609 | 3/1996 |
| JP | A-2005-097546 | 4/2005 |
| JP | A-2008-265275 | 11/2008 |
| WO | 2009127824 A1 | 10/2009 |
| WO | WO 2011/152539 A1 | 12/2011 |

OTHER PUBLICATIONS

Nov. 21, 2014 Extended European Search Report issued in European Application No. 12789179.4.
Jun. 5, 2012 International Written Opinion issued in International Application No. PCT/JP2012/061882.
Jun. 5, 2012 International Search Report issued in International Application No. PCT/JP2012/061882.

* cited by examiner

Primary Examiner — Ling Choi
Assistant Examiner — Jessica E Whiteley
(74) Attorney, Agent, or Firm — Oliff PLC

(57) ABSTRACT

There is provided provide a photosensitive resin composition which can markedly improve transparency, heat resistance, heat discoloration resistance, solvent resistance, and patterning properties. A photosensitive resin composition including: a polymer (A) in which a content of a unit structure containing a boronic acid group, a unit structure containing a boronic acid ester group, or a combination of these unit structures is 20 mol % to 100 mol % of a total molar number of unit structures constituting the polymer; and a photosensitizer (B). The polymer (A) preferably has a weight average molecular weight of 1,000 to 50,000. A cured film obtained from the photosensitive resin composition. A microlens prepared from the photosensitive resin composition.

7 Claims, No Drawings

PHOTOSENSITIVE RESIN COMPOSITION

TECHNICAL FIELD

The present invention relates to a photosensitive resin composition. More specifically, the present invention relates to a photosensitive resin composition which can markedly improve transparency, heat resistance, heat discoloration resistance, and solvent resistance and is preferably usable particularly as a material for forming a microlens.

BACKGROUND ART

Conventionally, as a material for forming a microlens, polyhydroxystyrene is known. However, due to the following problems, there is room for improvement. When the polyhydroxystyrene is used as a material for forming a microlens, due to heating performed at a high temperature, the semispherical shape of the microlens changes easily, so it is difficult to form a microlens with a stabilized shape. Moreover, polyhydroxystyrene tends to be easily colored by heating treatment and exhibit deterioration of transparency. Accordingly, coloration is sometimes recognized when the microlens is used.

Incidentally, compounds such as styrene-based polymers, acrylamide-based polymers, acrylic polymers, and vinyl pyrrolidone-based polymers having a boronic acid group on a side chain are known (for example, see Patent Documents 1 to 4). Further, a polymer having a boronic acid group on the terminal has been proposed (see Patent Document 5).

In addition, there is a disclosure regarding the use of a polymer, which has a boronic acid group on the terminal, as a photosensitive resin (see Patent Documents 6 and 7). In Patent Document 6, polyethylene glycol having an average molecular weight of 350 is reacted with a borane-dimethyl sulfide complex to obtain a polymer having a boronic acid group on one terminal. According to this document, 19.4 mol % of the total number of unit structures constituting the polymer contains a boronic acid group.

PRIOR ART DOCUMENTS

Patent Documents

Patent Document 1: Japanese Patent Application Publication No. 4-124145 (JP 4-124145 A)
Patent Document 2: Japanese Patent Application Publication No. 4-124144 (JP 4-124144 A)
Patent Document 3: Japanese Patent Application Publication No. 59-223706 (JP 59-223706 A)
Patent Document 4: Japanese Patent Application Publication No. 55-66910 (JP 55-66910 A)
Patent Document 5: Japanese Patent Application Publication No. 7-25918 (JP 7-25918 A)
Patent Document 6: Japanese Patent Application Publication No. 8-73690 (JP 8-73690 A)
Patent Document 7: Japanese Patent Application Publication No. 8-81609 (JP 8-81609 A)

SUMMARY OF THE INVENTION

Problem to be Solved by the Invention

An object of the present invention is to provide a photosensitive resin composition which can markedly improve transparency, heat resistance, heat discoloration resistance, solvent resistance, and patterning properties of a cured film obtained by curing. Another object of the present invention is to provide a cured film having markedly improved transparency, heat resistance, heat discoloration resistance, and solvent resistance. Moreover, another object of the present invention is to provide a photosensitive resin composition for forming a microlens that is preferably used as a material for forming a microlens.

Means for Solving the Problem

A first aspect of the present invention is a photosensitive resin composition comprising a polymer (A) in which a content of a unit structure containing a boronic acid group, a unit structure containing a boronic acid ester group, or a combination of these unit structures is 20 mol % to 100 mol % of a total molar number of unit structures constituting the polymer, and a photosensitizer (B);

a second aspect of the present invention is the photosensitive resin composition according to the first aspect, in which the polymer (A) is a polymer containing a unit structure of Formula (1):

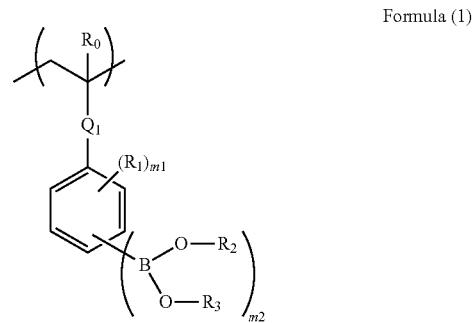

Formula (1)

(in the formula, $R_0$ is a hydrogen atom or a methyl group; $R_1$ is a halogen atom, an alkyl group, an alkoxy group, a thiol group, a cyano group, an amino group, an amide group, an alkylcarbonyl group, a thioalkyl group, a carboxy group, or a hydroxy group; each of $R_2$ and $R_3$ is independently a hydrogen atom or a $C_{1-10}$ alkyl group, and when $R_2$ and $R_3$ are $C_{1-10}$ alkyl groups, $R_2$ and $R_3$ may be combined with each other to form a cyclic structure; $Q_1$ is a single bond, a $C_{1-3}$ alkylene group, a $C_{6-20}$ arylene group, or a combination of these; m1 is an integer of 0 to 4; m2 is an integer of 1 to 5; and (m1+m2) is an integer of 1 to 5);

a third aspect of the present invention is the photosensitive resin composition according to the first aspect, in which the polymer (A) is a polymer containing the unit structure of Formula (1) and a unit structure of Formula (2) below:

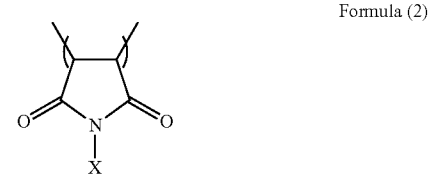

Formula (2)

(in the formula, X is a hydrogen atom, a $C_{1-10}$ alkyl group, a $C_5$ or $C_6$ cycloalkyl group, a phenyl group, or a benzyl group, and a portion or all of hydrogen atoms of the alkyl group, the cycloalkyl group, the phenyl group, and the benzyl group may be substituted with a halogen atom, a carboxy group, a hydroxy group, an amino group, or a nitro group);

a fourth aspect of the present invention is the photosensitive resin composition according to the first aspect, in which the polymer (A) further contains, in addition to the unit structure of Formula (1) or the unit structures of Formulae (1) and (2), a unit structure selected from a unit structure of Formula (3) below:

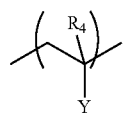

Formula (3)

(in the formula, $R_4$ is a hydrogen atom or a methyl group; and Y is a phenyl group, a naphthyl group, or a biphenylyl group, and a portion or all of hydrogen atoms of the phenyl group, the naphthyl group, and the biphenylyl group may be substituted with, a $C_{1-10}$ alkyl group, a halogen atom, a carboxy group, a hydroxy group, an amino group, or a nitro group) and a unit structure of Formula (4) below:

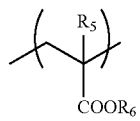

Formula (4)

(in the formula, $R_5$ is a hydrogen atom or a methyl group; and $R_6$ is a hydrogen atom, a $C_{1-10}$ alkyl group, an epoxy group, a glycidyl group, a $C_{6-20}$ aryl group, or a combination of these);

a fifth aspect of the present invention is the photosensitive resin composition according to any one of the first to fourth aspects, in which provided that a total molar number of the unit structures constituting the polymer (A) is 1.0, the polymer (A) is a polymer in which a proportion of a molar number n1 of the unit structure of Formula (1) satisfies $0.2 \leq n1 \leq 0.8$;

a sixth aspect of the present invention is the photosensitive resin composition according to any one of the first to fifth aspects, further comprising a crosslinkable compound having two or more substituents that can be thermally crosslinked with the polymer (A) in a molecule;

a seventh aspect of the present invention is the photosensitive resin composition according to any one of the first to sixth aspects, in which a weight average molecular weight of the polymer (A) is 1,000 to 50,000;

an eighth aspect of the present invention is a cured film obtained from the photosensitive resin composition according to any one of the first to seventh aspects; and a ninth aspect of the present invention is a microlens prepared from the photosensitive resin composition according to any one of the first to seventh aspects.

Effects of the Invention

The cured film formed of the photosensitive resin composition of the present invention can have excellent transparency, heat resistance, heat discoloration resistance, and solvent resistance.

Moreover, a patterned cured film formed of the photosensitive resin composition of the present invention can also have excellent heat resistance.

When the cured film formed of the photosensitive resin composition of the present invention is used for forming a microlens, during the formation process or a process for forming peripheral devices such as wiring, it is possible to markedly reduce possibilities that the lens shape may be deformed due to the coloration of the microlens when heating treatment is performed at a high temperature. In addition, when the process for forming electrodes and wiring is performed after the microlens is formed, the problems such as deformation and peeling of the microlens caused by an organic solvent can also be markedly reduced.

Accordingly, the photosensitive resin composition of the present invention is preferable as a material for forming a microlens.

MODES FOR CARRYING OUT THE INVENTION

The present invention is a photosensitive resin composition comprising a polymer (A) in which a content of a unit structure containing a boronic acid group, a unit structure containing a boronic acid ester group, or a combination of these unit structures is 20 mol % to 100 mol % of a total molar number of unit structures constituting the polymer, and a photosensitizer (B).

The photosensitive resin composition can contain the polymer (A), the photosensitizer (B), and a solvent.

The solid content of the photosensitive resin composition can be 1% by mass to 50% by mass, 3% by mass to 40% by mass, or 5% by mass to 30% by mass. The solid content is a proportion of balance that remains after the solvent is excluded from the photosensitive resin composition.

The content of the component (A) in the photosensitive resin composition of the present invention can be 1% by mass to 99% by mass, 20% by mass to 99% by mass, 20% by mass to 98% by mass, or 20% by mass to 97% by mass in general, based on the solid content.

The content of the component (B) in the photosensitive resin composition of the present invention can be 1% by mass to 50% by mass in general, based on the solid content.

Examples of the polymer (A) include polymers containing the unit structure of Formula (1).

In the formula (1), $R_0$ is a hydrogen atom or a methyl group, $R_1$ is a halogen atom, an alkyl group, an alkoxy group, a thiol group, a cyano group, an amino group, an amide group, an alkylcarbonyl group, a thioalkyl group, a carboxy group, or a hydroxy group. Each of $R_2$ and $R_3$ is independently a hydrogen atom or a $C_{1-10}$ alkyl group, and when $R_2$ and $R_3$ are hydrocarbon groups, these may form a cyclic structure. $Q_1$ is a single bond or a $C_{1-3}$ alkylene group, a $C_{6-20}$ arylene group, or a combination of these. m1 is an integer of 0 to 4, m2 is an integer of 1 to 5, and (m1+m2) is an integer of 1 to 5.

Examples of the $C_{1-10}$ alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, a 2-ethyl-3-methyl-cyclopropyl group, and a cyclohexylmethyl group.

Examples of the $C_{1-3}$ alkylene group include a methylene group, an ethylene group, a propylene group, and an isopropylene group.

Examples of the $C_{6-20}$ aryl group include divalent organic groups derived from a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Among these, when a 1,2-naphthoquinone diazide compound is used as the following component (B), it is preferable that the photosensitive resin composition contain, as the polymer (A), a unit structure of Formula (5) below in which $R_2$ and $R_3$ in the unit structure of Formula (1) are hydrogen atoms.

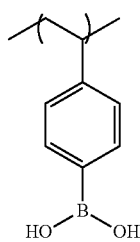

Formula (5)

The polymer (A) used in the present invention can be a polymer containing the unit structure of Formula (1) and the unit structure of Formula (2).

In Formula (2), X is a hydrogen atom, a $C_{1-10}$ alkyl group, a $C_5$ or $C_6$ cycloalkyl group, a phenyl group, or a benzyl group, and a portion or all of hydrogen atoms of the alkyl group, the cycloalkyl group, the phenyl group, and the benzyl group may be substituted with a halogen atom, a carboxy group, a hydroxy group, an amino group, or a nitro group. Examples of the $C_{1-10}$ alkyl group include the alkyl group described above.

The polymer (A) used in the present invention can be a polymer that further contains, in addition to the unit structure of Formula (1) or the unit structures of Formulae (1) and (2), a unit structure selected from unit structures of Formulae (3) and (4).

In Formulae (3) and (4), each of $R_4$ and $R_5$ is independently a hydrogen atom or a methyl group, Y is a phenyl group, a naphthyl group, or a biphenylyl group, and a portion or all of hydrogen atoms of the phenyl group, the naphthyl group, and the biphenylyl group may be substituted with a $C_{1-10}$ alkyl group, a halogen atom, a carboxy group, a hydroxy group, an amino group, or a nitro group. $R_6$ is a hydrogen atom, a $C_{1-10}$ alkyl group, an epoxy group, a glycidyl group, a $C_{6-20}$ aryl group, or a combination of these. Examples of the $C_{1-10}$ alkyl group and the $C_{6-20}$ aryl group include the same ones as described above.

Provided that a total molar number of the unit structures constituting the polymer (A) is 1.0, the polymer (A) can be a polymer in which a proportion of a molar number n1 of the unit structure of Formula (1) satisfies $0.2 \leq n1 \leq 0.8$ or $0.5 \leq n1 \leq 0.8$.

When the polymer as a component (A) is a copolymer having, in addition to the unit structure of Formula (1), one or two or more kinds of units among the structural units of Formulae (2) to (4), a molar ratio between the unit structure of Formula (1) and the unit structure selected from Formulae (2) to (4) is usually 20 to 90:80 to 10 and preferably 20 to 70:80 to 30.

Provided that a total molar number of the unit structures constituting the polymer (A) is 1.0, the polymer (A) can be a polymer in which a proportion of a molar number n2 of the unit structure of Formula (2) satisfies $0.01 \leq n2 \geq 0.7$ or $0.01 \leq n2 \leq 0.49$.

Provided that a total molar number of the unit structures constituting the polymer (A) is 1.0, the polymer (A) can be a polymer in which a proportion of a molar number n3 of the unit structure of Formula (3) and/or Formula (4) satisfies $0.01 \leq n3 \leq 0.7$ or $0.01 \leq n3 \leq 0.49$.

A weight average molecular weight of the polymer is usually 1,000 to 50,000 and preferably 1,500 to 30,000. Moreover, the weight average molecular weight is a value obtained by gel permeation chromatography (GPC) by using polystyrene as a standard sample.

In the present invention, methods for obtaining the polymer which is the component (A) and has a structural unit containing a boronic acid group and/or a boronic acid ester group are not particularly limited. However, the polymer is generally obtained by subjecting a monomer mixture, which contains a monomer species used for obtaining the above polymer, to a polymerization reaction in a polymerization solvent usually at a temperature of 50° C. to 110° C. Moreover, as a method for obtaining the polymer which has a structural unit containing a boronic acid group, first, a polymer which has a structural unit containing a boronic acid ester group is synthesized, and then the polymer is treated with an acid to cause a degradation reaction of the boronic acid ester group, whereby the polymer can also be obtained.

The photosensitizer as the component (B) of the present invention is not particularly limited as long as it is a compound usable as photosensitive component, but a 1,2-naphthoquinone diazide compound is preferable.

The 1,2-naphthoquinone diazide compound is a compound having hydroxy groups, and it is possible to use a compound in which 10 mol % to 100 mol %, preferably 20 mol % to 95 mol % of those hydroxy groups have turned into 1,2-naphthoquinone diazide sulfonic acid ester.

Examples of the compound having hydroxy groups include phenol compounds such as phenol, o-cresol, m-cresol, p-cresol, hydroquinone, resorcinol, catechol, methyl gallate, ethyl gallate, 1,3,3-tris(4-hydroxyphenyl)butane, 4,4'-isopropylidenediphenol, 1,1-bis(4-hydroxyphenyl)cyclohexane, 4,4'-dihydroxydiphenylsulfone, 4,4'-(hexafluoroisopropylidene)diphenol, 4,4',4''-trishydroxyphenylethane, 1,1,1-trishydroxyphenylethane, 4,4'-[1-[4-[1-(4-hydroxyphenyl)-1-methylethyl]phenyl]ethylidene]bishenol, 2,4-dihydroxybenzophenone, 2,3,4-trihydroxybenzophenone, 2,2',4,4'-tetrahydroxybenzophenone, 2,3,4,4'-tetrahydroxybenzophenone, and 2,2',3,4,4'-pentahydroxybenzophenone, and aliphatic alcohols such as ethanol, 2-propanol, 4-butanol, cyclohexanol, ethylene glycol, propylene glycol, diethylene glycol, dipropylene glycol, 2-methoxyethanol, 2-butoxyethanol, 2-methoxypropanol, 2-butoxypropanol, ethyl lactate, and butyl lactate.

These photosensitizers can be used alone or used in combination of two or more of them.

The photosensitive resin composition of the present invention can also contain a crosslinking agent as a component (C). The crosslinking agent as the component (C) of the present invention is a compound forming a bond between a compounded composition such as a resin or a photosensitizer and other molecules of the crosslinking agent, by the action of heat or an acid. Examples of the crosslinking agent include polyfunctional (meth)acrylate compounds, epoxy compounds, hydroxymethyl group-substituted phenol compounds, compounds having alkoxyalkylated amino groups, and compounds having protected isocyanate groups.

These crosslinking agents can be used alone or used in combination of two or more of them.

Examples of the polyfunctional (meth)acrylate compounds include trimethylolpropane tri(meth)acrylate, di-trimethylolpropane tetra(meth)acrylate, pentaerythritol tri(meth)acrylate, pentaerythritol tetra(meth)acrylate, di-pentaerythritol penta(meth)acrylate, di-pentaerythritol hexa(meth)acrylate, glycerin tri(meth)acrylate, tris(2-hydroxyethyl)isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, and bis(2-hydroxyethyl)isocyanurate di(meth)acrylate.

Specific examples of the epoxy compounds include the following commercially available products, but the present invention is not limited to these. Examples of bisphenol A-type epoxy resins include jER (registered trademark) 828, 834, 1001, and 1004 (all manufactured by Mitsubishi Chemical Corporation), and EPICLON (registered trademark) 850, 860, and 4055 (all manufactured by DIC Corporation). Examples of bisphenol F-type epoxy resins include jER (registered trademark) 807 (manufactured by Mitsubishi Chemical Corporation) and EPICLON (registered trademark) 830 (manufactured by DIC Corporation). Examples of phenol novolac-type epoxy resins include EPICLON (registered trademark) N-740, N-770, and N-775 (all manufactured by DIC Corporation) and jER (registered trademark) 152 and 154 (all manufactured by Mitsubishi Chemical Corporation). Examples of cresol novolac-type epoxy resins include EPICLON (registered trademark) N-660, N-665, N-670, N-673, N-680, N-695, N-665-EXP, and N-672-EXP (all manufactured by DIC Corporation). Examples of glycidyl amine-type epoxy resins include EPICLON (registered trademark) 430 and 430-L (all manufactured by DIC Corporation), TETRAD (registered trademark) -C and TETRAD (registered trademark) -X (all manufactured by MITSUBISHI GAS CHEMICAL COMPANY, INC.), jER (registered trademark) 604 and 630 (all manufactured by Mitsubishi Chemical Corporation), SUMIEPOXY (registered trademark) ELM 120, ELM100, ELM 434, and ELM 434HV (all manufactured by Sumitomo Chemical Co., Ltd.), and EPOTOHTO (registered trademark) YH-434 and YH-434L (all manufactured by TOHTO Chemical Industry Co., Ltd.). Examples of alicyclic epoxy resins include DENACOL (registered trademark) EX-252 (manufactured by Nagase ChemteX Corporation), EPICLON (registered trademark) 200 and 400 (all manufactured by DIC Corporation), and jER (registered trademark) 871 and 872 (all manufactured by Mitsubishi Chemical Corporation). Examples of epoxy resins having a cyclohexene oxide structure include EPOLEAD (registered trademark) GT-401, GT-403, GT-301, and GT-302, and CELLOXIDE (registered trademark) 2021 and 3000 (all manufactured by Daicel Corporation).

Examples of the hydroxymethyl group-substituted phenol compounds include 2-hydroxymethyl-4,6-dimethylphenol, 1,3,5-trihydroxymethylbenzene, and 3,5-dihydroxymethyl-4-methoxytoluene[2,6-bis(hydroxylmethyl)-p-cresol].

The compounds having alkoxyalkylated amino groups are sometimes mixtures of plural substituted compounds. A portion of them are mixtures containing oligomer components by undergoing self-condensation, and such mixtures are also usable. More specific examples thereof include products of CYMEL series such as hexamethoxymethyl melamine (manufactured by Nihon Cytec Industries Inc., CYMEL (registered trademark) 303), tetrabutoxymethyl glycoluril (manufactured by Nihon Cytec Industries Inc., CYMEL (registered trademark) 1170), and tetramethoxymethyl benzoguanamine (manufactured by Nihon Cytec Industries Inc., CYMEL (registered trademark) 1123), and products of NIKALAC series such as methylated melamine resins (manufactured by Sanwa Chemical co., LTD., NIKALAC (registered trademark) MW-30HM, MW-390, MW-100LM, and MX-750LM), methylated urea resins (manufactured by Sanwa Chemical co., LTD., NIKALAC (registered trademark) MX-270, MX-280, and MX-290).

The compounds having protected isocyanate groups can be obtained by, for example, causing an appropriate blocking agent to act on a compound having two or more isocyanate groups in one molecule.

Examples of the compound having isocyanate groups include isophorone diisocyanate, 1,6-hexamethylene diisocyanate, methylene bis(4-cyclohxylisocyanate), trimethyl hexamethylene diisocyanate, and dimers or trimers of these, and products obtained by a reaction between the above compounds and diols, triols, diamines, or triamines.

Examples of the blocking agent include alcohols such as methanol, ethanol, isopropanol, n-butanol, 2-ethoxyhexanol, 2-N,N-dimethylaminoethanol, 2-ethoxyethanol, and cyclohexanol, phenols such as phenol, o-nitrophenol, p-chlorophenol, and o-, m-, or p-cresol, lactams such as ε-caprolactam, oximes such as acetone oxime, methyl ethyl ketone oxime, methyl isobutyl ketone oxime, cyclohexanone oxime, acetophenone oxime, and benzophenone oxime, pyrazoles such as pyrazole, 3,5-dimethylpyrazole, and 3-methylpyrazole, and thiols such as dodecane thiol and benzene thiol.

Examples of commercially available products thereof include VESTANAT B1358/100 and VESTAGON BF 1540 (all isocyanurate-type modified polyisocyanates, manufactured by Degussa Japan Company Limited), TAKANATE (registered trademark) B-882N and TAKANATE B-7075 (all isocyanurate-type modified polyisocynurate, manufactured by Mitsui Chemicals, Inc.).

The content of the component (C) in the photosensitive resin composition of the present invention can be 1% by mass to 50% by mass based on the solid content.

Methods for preparing the photosensitive resin composition are not particularly limited, but examples thereof include a method of dissolving the copolymer as the component (A) in a solvent, and mixing this solution with the photosensitizer as the component (B) and optionally with the crosslinking agent as the component (C) in a predetermined proportion to obtain a homogeneous solution. The examples also include a method of optionally further adding other additives thereto and mixing them at an appropriate stage in the above preparation method.

The solvent is not particularly limited as long as it can dissolve the components (A), (B), and (C).

Examples of the solvent include ethylene glycol monomethyl ether, ethylene glycol monoethyl ether, methyl cellsolve acetate, ethyl cellosolve acetate, diethylene glycol monomethyl ether, diethylene glycol monoethyl ether, propylene glycol, propylene glycol monomethyl ether, propylene glycol momethyl ether acetate, propylene glycol propyl ether acetate, propylene glycol monobutyl ether, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl acetate, butyl acetate, ethyl lactate, butyl lactate, 2-heptanone, and γ-butyrolactone.

These solvents can be used alone or used in combination of two or more of them.

Among these, in view of the improving leveling properties of coating film, propylene glycol monomethyl ether, propylene glycol monomethyl ether acetate, 2-heptanone, ethyl lactate, butyl lactate, and cyclohexanone are preferable.

Moreover, the photosensitive resin composition of the present invention can also contain a surfactant to improve coating properties.

Examples of the surfactant include: nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl allyl ethers such as polyoxyethylene octyl phenol ether and polyoxyethylene nonyl phenol ether, polyoxyethylene-polyoxypropylene block copolymers, sorbitan fatty acid esters such as sorbitan monolaurate, sorbitan monoplamitate, sorbitan monosterate, sorbitan monooleate, sorbitan trioleate, and sorbitan tristearate, and polyoxyethylene sorbitan fatty acid esters such as polyoxyethylene sorbitan monolaurate, polyoxyethylene sorbitan monoplamitate, polyoxyethylene sorbitan monostearate, polyoxyethylene sorbitan trioleate, and polyoxyethylene sorbitan tristearate; fluorosurfactants such as EFTOP (registered trademark) EF301, EF303, and EF352 (all manufactured by Mitsubishi Materials Electronic Chemicals Co., Ltd. (former Gemco, Co., Ltd.)), MEGAFACE (registered trademark) F171, F173, and R30 (all manufactured by DIC Corporation), FLUORAD FC430 and FC431 (all manufactured by Sumitomo 3M, Limited) ASAHIGUARD (registered trademark) AG710 and SURFLON (registered trademark) S-382, SC101, SC102, SC103, SC104, SC105, and SC106 (manufactured by ASAHI GLASS CO., LTD.), FUTAGENT series (manufactured by NEOS COMPANY LIMITED) such as FTX-206D, FTX-212D, FTX-218, FTX-220D, FTX-230D, FTX-240D, FTX-212P, FTX-220P, FTX-228P, and FTX-240G; and an organosiloxane polymer KP341 (manufactured by Shin-Etsu Chemical Co., Ltd.).

The surfactants can be used alone or used in combination of two or more of them.

Moreover, when the above surfactant is used, the content thereof in the photosensitive resin composition of the present invention is 3% by mass or less, preferably 1% by mass or less, and more preferably 0.5% by mass or less, based on the content thereof in the solid content of the photosensitive resin composition.

In addition, as long as the effects of the present invention are not diminished, the photosensitive resin composition of the present invention can optionally contain additives such as a curing aid, a UV absorber, a sensitizer, a plasticizer, an antioxidant, and an adhesion aid.

Hereinafter, the use of the photosensitive resin composition of the present invention will be described.

The photosensitive resin composition of the present invention is coated onto a substrate (for example, a semiconductor substrate such as silicon covered with silicon oxide film, a semiconductor substrate such as silicon covered with silicon nitride film or oxynitride silicon film, a silicon nitride substrate, a quartz substrate, a glass substrate (including alkali-free glass, low-alkali glass, and crystallized glass), and a glass substrate in which an ITO film is formed) by an appropriate coating method by using a spinner or coater. Thereafter, the resultant is pre-baked using heating means such as a hot plate, thereby forming a coating film.

The pre-baking conditions are appropriately selected within a baking temperature of 80° C. to 250° C. and a baking time of 0.3 to 60 minutes. The baking temperature is preferably 80° C. to 150° C., and the baking time is preferably 0.5 to 5 minutes.

Further, the thickness of the film formed of the photosensitive resin composition of the present invention is 0.005 μm to 3.0 μm and preferably 0.01 μm to 1.0 μm.

Subsequently, the film obtained as above is exposed to light through a mask (reticle) for forming a predetermined pattern. For the exposure, for example, g-rays, i-rays, and a KrF excimer laser are usable. After the exposure, post exposure bake is optionally performed. The conditions of the post exposure bake are appropriately selected within a heating temperature of 80° C. to 150° C. and a heating time of 0.3 to 60 minutes. Thereafter, the film is developed with an alkaline developer.

Examples of the alkaline developer include aqueous alkaline solutions, for example, aqueous solutions of alkaline metal hydroxide such as potassium hydroxide and sodium hydroxide, aqueous solutions of quaternary ammonium hydroxide such as tetramethyl ammonium hydroxide, tetraethyl ammonium hydroxide, and choline, and aqueous solutions of amine such as ethanolamine, propylamine, and ethylenediamine.

Moreover, a surfactant can also be added to these developers.

The conditions of developing are appropriately selected within a developing temperature of 5° C. to 50° C. and a developing time of 10 to 300 seconds. The film formed of the composition of the present invention can be easily developed at room temperature by using an aqueous tetramethyl ammonium hydroxide solution. After being developed, the film is rinsed with ultra-pure water and the like.

Next, by using, for example, g-rays, i-rays, or a KrF excimer laser, the entire surface of the substrate is exposed to light. Thereafter, the substrate is post-baked using heating means such as a hot plate. The conditions of the post baking are appropriately selected within a baking temperature of 100° C. to 250° C. and a baking time of 0.5 to 60 minutes.

EXAMPLES

Hereinafter, the present invention will be described in more detail based on examples and comparative examples, but the present invention is not limited to these examples.

[Measurement of Weight Average Molecular Weight of Polymers Obtained by the Following Synthesis Examples]

Device: GPC system manufactured by JASCO Corporation

Columns: Shodex [registered trademark] KF-804L and 803L

Column oven: 40° C.

Flow rate: 1 ml/min

Eluent: tetrahydrofuran

[Synthesis of Monomer]

25 g of 4-vinylphenyl boronic acid, 12.8 g of 1,2-propanediol, 340 g of dichloromethane, and 15 g of magnesium sulfate were put into a reactor and reacted for 18 hours at room temperature, and then magnesium sulfate was removed by filtration. Thereafter, the solvent was evaporated, thereby obtaining a transparent oily substance. The obtained compound was 4-vinylphenyl boronic acid-1,2-propanediol ester corresponding to Formula (6).

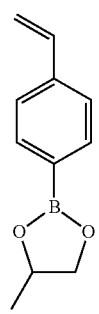

Formula (6)

[Synthesis of Polymer]

Synthesis Example 1

10.0 g of 4-vinylphenyl boronic acid-1,2-propanediol ester, 9.5 g of N-cyclohexylmaleimide, and 1.0 g of dimethyl 2,2'-azobis(isobutyrate) were dissolved in 82.0 g of propylene glycol monomethyl ether acetate, and then this solution was added dropwise over 3 hours to a flask containing 102.0 g of propylene glycol monomethyl ether kept at 80° C. After the dropwise addition ended, the solution was reacted for 12 hours. A weight average molecular weight Mw of the polymer in the reaction solution was 21,200 (expressed in terms of polystyrene).

After being cooled to room temperature, the reaction solution was poured into a methanol solvent to reprecipitate the polymer. The filtered substance was dissolved in a hydrochloric acid/methanol solvent and stirred for 3 hours at room temperature. Subsequently, the solution was poured into a diethyl ether solvent to cause reprecipitation, followed by drying under reduced pressure, thereby obtaining a polymer (copolymer) containing a unit structure of 4-vinylphenyl boronic acid and a unit structure of N-cyclohexylmaleimide of Formula (7) below at a molar ratio of 1:1.

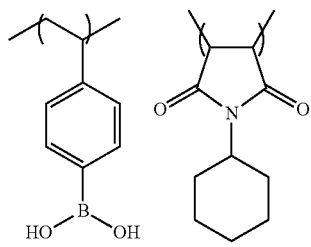

Formula (7)

Synthesis Example 2

10.0 g of 4-vinylphenyl boronic acid-1,2-propanediol ester, 9.5 g of N-phenylmaleimide, and 1.0 g of dimethyl 2,2'-azobis(isobutyrate) were dissolved in 82.0 g of propylene glycol monomethyl ether acetate, and then this solution was added dropwise over 3 hours to a flask containing 103.0 g of propylene glycol monomethyl ether kept at 80° C. After the dropwise addition ended, the solution was reacted for 12 hours. A weight average molecular weight Mw of the polymer in the reaction solution was 20,400 (expressed in terms of polystyrene).

After being cooled to room temperature, the reaction solution was poured into a methanol solvent to reprecipitate the polymer. The filtered substance was dissolved in a hydrochloric acid/methanol solvent and stirred for 3 hours at room temperature. Subsequently, the solution was poured into a diethyl ether solvent to cause reprecipitation, followed by drying under reduced pressure, thereby obtaining a polymer (copolymer) containing a unit structure of 4-vinylphenyl boronic acid and a unit structure of N-phenylmaleimide of Formula (8) below at a molar ratio of 1:1.

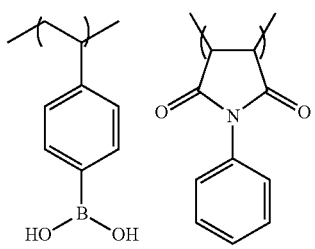

Formula (8)

Synthesis Example 3

10.0 g of 4-vinylphenyl boronic acid-1,2-propanediol ester, 5.5 g of styrene, and 0.8 g of dimethyl 2,2'-azobis (isobutyrate) were dissolved in 65.0 g of propylene glycol monomethyl ether acetate, and then this solution was added dropwise over 3 hours to a flask containing 82.0 g of propylene glycol monomethyl ether kept at 80° C. After the dropwise addition ended, the solution was reacted for 12 hours. A weight average molecular weight Mw of the polymer in the reaction solution was 8,200 (expressed in terms of polystyrene).

After being cooled to room temperature, the reaction solution was poured into a methanol solvent to reprecipitate the polymer. The filtered substance was dissolved in a hydrochloric acid/methanol solvent and stirred for 3 hours at room temperature. Subsequently, the solution was poured into a water/methanol solvent to cause reprecipitation, followed by drying under reduced pressure, thereby obtaining a polymer (copolymer) containing a unit structure of 4-vinylphenyl boronic acid and a unit structure of styrene of Formula (9) below at a molar ratio of 1:1.

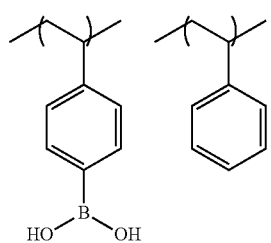

Formula (9)

Synthesis Example 4

10 g of 4-vinylphenyl boronic acid-1,2-propanediol ester, 0.8 g of styrene, 5.5 g of N-cyclohexylmaleimide, and 0.9 g of dimethyl 2,2'-azobis(isobutyrate) were dissolved in 75.0 g of propylene glycol monomethyl ether acetate, and then this solution was added dropwise over 3 hours to a flask containing 94.0 g of propylene glycol monomethyl ether kept at 80° C. After the dropwise addition ended, the solution was reacted for 12 hours. A weight average molecular weight Mw of the polymer in the reaction solution was 20,500 (expressed in terms of polystyrene).

After being cooled to room temperature, the reaction solution was poured into a methanol solvent to reprecipitate the polymer. The filtered substance was dissolved in a hydrochloric acid/methanol solvent and stirred for 3 hours at room temperature. Subsequently, the solution was poured into a diethyl ether solvent to cause reprecipitation, followed by drying under reduced pressure, thereby obtaining a polymer (copolymer) containing a unit structure of 4-vinylphenyl boronic acid, a unit structure of styrene, and a unit structure of N-cyclohexylmaleimide of Formula (10) below at a molar ratio of 1:0.15:0.58.

Formula (10)

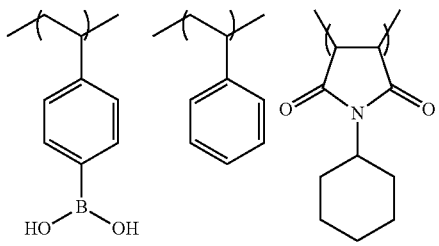

Comparative Synthesis Example 1

5.0 g of 4-vinylphenyl boronic acid-1,2-propanediol ester, 27.0 g of N-cyclohexylmaleimide, and 1.6 g of dimethyl 2,2'-azobis(isobutyrate) were dissolved in 134.4 g of propylene glycol monomethyl ether acetate, and then this solution was added dropwise over 3 hours to a flask containing 168.0 g of propylene glycol monomethyl ether kept at 80° C. After the dropwise addition ended, the solution was reacted for 12 hours. A weight average molecular weight Mw of the polymer in the reaction solution was 3,700 (expressed in terms of polystyrene).

After being cooled to room temperature, the reaction solution was poured into a methanol solvent to reprecipitate the polymer. The filtered substance was dissolved in a hydrochloric acid/methanol solvent and stirred for 3 hours at room temperature. Thereafter, the solution was poured into a diethylether solvent to cause reprecipitation, followed by drying under reduced pressure, thereby obtaining a polymer (copolymer) containing a unit structure of 4-vinylphenyl boronic acid and a unit structure of N-cyclohexylmaleimide of Formula (7) at a molar ratio of 3:17.

[Preparation of Photosensitive Resin Composition Solution]

Example 1

5 g of the polymer as the component (A) obtained in Synthesis example 1, 1.5 g of P-200 (manufactured by Toyo Gosei CO. Ltd.) which was the photosensitizer as the component (B), 1.0 g of EPOLEAD (registered trademark) GT-401 (manufactured by Daicel Corporation) as the component (C), and 0.02 g of MEGAFACE R-30 (manufactured by DIC Corporation) as a surfactant were dissolved in 28.6 g of propylene glycol monomethyl ether and 13.1 g of ethyl lactate to form a solution. Thereafter, the solution was filtered through a microfilter made of polyethylene having a pore diameter of 0.20 μm, thereby preparing a photosensitive resin composition.

Example 2

A photosensitive resin composition was prepared under the same conditions as in Example 1, except that the polymer obtained in Synthesis example 2 was used in an amount of 5.0 as the component (A).

Example 3

A photosensitive resin composition was prepared under the same conditions as in Example 1, except that the polymer obtained in Synthesis example 3 was used in an amount of 5.0 as the component (A).

Example 4

A photosensitive resin composition was prepared under the same conditions as in Example 1, except that the polymer obtained in Synthesis example 4 was used in an amount of 5.0 as the component (A).

Example 5

A photosensitive resin composition was prepared under the same conditions as in Example 1, except that CYMEL (registered trademark) 303 (manufactured by Nihon Cytec Industries Inc.) was used in an amount of 1.0 g as the component (C).

Example 6

A photosensitive resin composition was prepared under the same conditions as in Example 1, except that VESTANAT B1358/100 (manufactured by Degussa Japan Company Limited) was used in an amount of 1.0 g as the component (C).

Comparative Example 1

9 g of poly(4-vinylphenol) (manufactured by Sigma-Aldrich Japan, a weight average molecular weight Mw of 20,000) having a structural unit of Formula (11) below, 2.7 g of P-200 (manufactured by Toyo Gosei CO. Ltd.) as a photosensitizer, 1.4 g of CYMEL (registered trademark) 303 (manufactured by Nihon Cytec Industries Inc.) as a crosslinking agent, and 0.03 g of MEGAFACE (registered trademark) R-30 (manufactured by DIC Corporation) as a surfactant were dissolved in 46.0 g of propylene glycol monomethyl ether and 19.7 g of ethyl lactate to form a solution. Thereafter, the solution was filtered through a microfilter made of polyethylene having a pore diameter of 0.10 μm, thereby preparing a photosensitive resin composition.

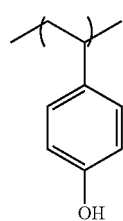

Formula (11)

Comparative Example 2

A photosensitive resin composition was prepared under the same conditions as in Example 1, except that the polymer obtained in the Comparative synthesis example 1 was used in an amount of 5.0 g as the component (A).

[Measurement of Transmittance]

The photosensitive resin compositions prepared in Examples 1 to 6 and Comparative example 1 were each coated onto a quartz substrate by using a spin coater, and the resultant was pre-baked on a hot plate for 3 minutes at 100° C. Subsequently, the entire surface of the resultant was irradiated with UV rays from a UV irradiation device PLA-501(F) (manufactured by CANON. INC) at an irradiation dose of 500 mJ/cm² at 365 nm (photobleaching). Thereafter, the resultant was post-baked on a hot plate for 5 minutes at 200° C., thereby forming a film having a thickness of 600 nm. By using A UV/Vis spectrophotometer UV-2550 (manufactured by Shimadzu Corporation), a transmittance of this film at a wavelength of 400 nm was measured. Moreover, after the film was heated at 260° C. for 5 minutes, a transmittance at a wavelength of 400 nm was measured. The evaluation results are shown in Table 1.

TABLE 1

| | Transmittance/% (400 nm) | |
| --- | --- | --- |
| | After baking at 200° C. | After baking at 260° C. |
| Example 1 | 99% | 97% |
| Example 2 | 99% | 98% |
| Example 3 | 99% | 97% |
| Example 4 | 99% | 96% |
| Example 5 | 99% | 97% |
| Example 6 | 99% | 97% |
| Comparative example 1 | 95% | 78% or less |
| Comparative example 2 | 99% | 98% |

As shown in the results of Table 1, the film formed of the photosensitive resin composition of the present invention had a high degree of heat resistance and was hardly colored even after being heated at 260° C. On the other hand, though the transmittance of the film of Comparative example 1 was 95% even after the film was post-baked at 200° C. for 5 minutes, after the film was further heated at 260° C. for 5 minutes, the transmittance of the film was reduced to 78% or less. Usually, the transmittance of a film is required to be 90% or higher, and it is desirable that the transmittance hardly change even after heating. However, Comparative example 1 did not yield results satisfying any of the requirements.

[Patterning Test]

The photosensitive resin compositions prepared in Examples 1 to 6 and Comparative example 2 were each coated onto a silicon wafer by using a spin coater, and the resultant was pre-baked on a hot plate for 90 seconds at 100° C., thereby forming a photosensitive resin film having a thickness of 600 nm. Subsequently, by using an i-ray stepper NSR-2205i12D (NA=0.63) (manufactured by Nikon Corporation), the film was exposed to light through a grayscale mask. The film was then subjected to post exposure baking (PEB) on a hot plate for 90 seconds at 100° C., developed for 60 seconds with a 2.38% by mass of an aqueous TMAH solution, and rinsed with ultra-pure water for 20 seconds, followed by drying, thereby forming a lens pattern having a diameter of 2.0 μm. Thereafter, by using the above i-ray stepper, the entire surface of the film was irradiated with i-rays at 500 mJ/cm² (photobleaching), and the film was completely baked (first, baked for 5 minutes at 100° C. to 180° C. and then baked for 5 minutes by raising the temperature to 180° C. to 200° C.) on a hot plate. The film was further heated for 5 minutes at 260° C. By using a scanning electron microscope S-4800 (manufactured by Hitachi High-Technologies Corporation), the pattern obtained after developing, rinsing, and drying, the pattern obtained after complete baking, and the pattern obtained after heating at 260° C. were observed.

In any of the Examples 1 to 6, the pattern shape obtained after the post baking and after the heating at 260° C. was confirmed to maintain the shape of lens pattern obtained after developing, rinsing, and drying. Regarding Comparative example 2, both the exposed portion and non-exposed portion did not dissolve in the developer, and a pattern could not be formed.

[Test for Elution into Photoresist Solvent]

The photosensitive resin compositions prepared in Examples 1 to 6 were each coated onto a silicon wafer by using a spin coater and pre-baked on a hot plate for 3 minutes at 100° C. Thereafter, the entire surface of the resultant was irradiated with UV rays from a UV irradiation device PLA-501 (manufactured by CANON. INC) at an irradiation dose of 500 mJ/cm² at 365 nm (photobleaching). Subsequently, the resultant was post-baked on a hot plate for 5 minutes at 200° C., thereby forming a film having a thickness of 600 nm. These films were soaked into each of acetone, N-methylpyrrolidone, 2-propanol, and 2-heptanone respectively for 10 minutes at 23° C.

In any of Examples 1 to 6, the change in film thickness before and after soaking into each of the above solvents was confirmed to be 5% or less.

INDUSTRIAL APPLICABILITY

The present invention is usable as a photosensitive resin composition improved in terms of transparency, heat resistance, heat discoloration resistance, solvent resistance, and patterning properties.

The invention claimed is:

1. A photosensitive resin composition comprising:
a polymer (A) in which a content of a unit structure containing a boronic acid group, a unit structure containing a boronic acid ester group, or a combination thereof is 20 mol % to 100 mol % of a total molar number of unit structures constituting the polymer (A); and
a photosensitizer (B);
wherein:
the polymer (A) is a copolymer comprising a unit structure of Formula (1):

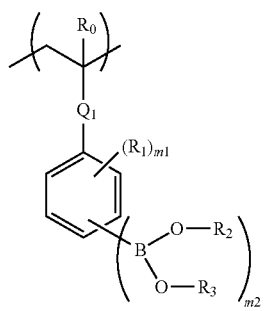

Formula (1)

where:
R$_0$ is a hydrogen atom or a methyl group;
R$_1$ is a halogen atom, an alkyl group, an alkoxy group, a thiol group, a cyano group, an amino group, an amide group, an alkylcarbonyl group, a thioalkyl group, a carboxy group, or a hydroxy group;
each of R$_2$ and R$_3$ is independently a hydrogen atom or a C$_{1-10}$ alkyl group, and when R$_2$ and R$_3$ are C$_{1-10}$ alkyl groups, R$_2$ and R$_3$ are optionally combined with each other to form a cyclic structure;
Q$_1$ is a single bond, a C$_{1-3}$ alkylene group, a C$_{6-20}$ arylene group, or a combination of a C$_{1-3}$ alkylene group and a C$_{6-20}$ arylene group;
m1 is an integer of 0 to 4;
m2 is an integer of 1 to 5; and
a sum of m1 and m2 is an integer of 1 to 5; and
the polymer (A) is a copolymer in which a proportion of a molar number of the unit structure of Formula (1) is greater than or equal to 0.2 and less than or equal to 0.8 provided that the total molar number of the unit structures constituting the polymer (A) is 1.0.

2. The photosensitive resin composition according to claim 1, wherein the polymer (A) further comprises the unit structure of Formula (1) and a unit structure of Formula (2):

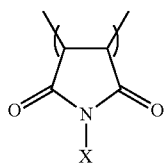

Formula (2)

where:
X is a hydrogen atom, a C$_{1-10}$ alkyl group, a C$_5$ or C$_6$ cycloalkyl group, a phenyl group, or a benzyl group, and a portion or all of hydrogen atoms of the alkyl group, the cycloalkyl group, the phenyl group, and the benzyl group are optionally substituted with a halogen atom, a carboxy group, a hydroxy group, an amino group, or a nitro group.

3. The photosensitive resin composition according to claim 1, wherein the polymer (A) further comprises a unit structure selected from the group consisting of a unit structure of Formula (3) and a unit structure of Formula (4)

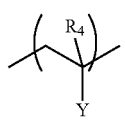

Formula (3)

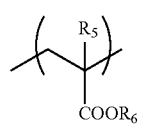

Formula (4)

where:
R$_4$ is a hydrogen atom or a methyl group; and
Y is a phenyl group, a naphthyl group, or a biphenylyl group, and a portion or all of hydrogen atoms of the phenyl group, the naphthyl group, and the biphenylyl group are optionally substituted with a C$_{1-10}$ alkyl group, a halogen atom, a carboxy group, a hydroxy group, an amino group, or a nitro group;
R$_5$ is a hydrogen atom or a methyl group; and
R$_6$ is a hydrogen atom, a C$_{1-10}$ alkyl group, an epoxy group, a glycidyl group, a C$_{6-20}$ aryl group, or a combination thereof.

4. The photosensitive resin composition according to claim 1, further comprising a crosslinkable compound having two or more substituents that can be thermally crosslinked with the polymer (A) in a molecule.

5. The photosensitive resin composition according to claim 1, wherein a weight average molecular weight of the polymer (A) is 1,000 to 50,000.

6. A cured film obtained from the photosensitive resin composition according to claim 1.

7. A microlens prepared from the photosensitive resin composition according to claim 1.

* * * * *